(12) United States Patent
Ehlen

(10) Patent No.: US 10,334,746 B2
(45) Date of Patent: Jun. 25, 2019

(54) COMPONENT MOUNTING ASSEMBLY

(71) Applicant: Facebook, Inc., Menlo Park, CA (US)

(72) Inventor: Jon Brian Ehlen, Newark, CA (US)

(73) Assignee: Facebook, Inc., Menlo Park, CA (US)

( * ) Notice: Subject to any disclaimer, the term of this patent is extended or adjusted under 35 U.S.C. 154(b) by 395 days.

(21) Appl. No.: 14/704,322

(22) Filed: May 5, 2015

(65) Prior Publication Data

US 2016/0330858 A1 Nov. 10, 2016

(51) Int. Cl.
*H05K 7/14* (2006.01)

(52) U.S. Cl.
CPC ............... *H05K 7/1489* (2013.01)

(58) Field of Classification Search
CPC ............... H05K 7/1489; H05K 7/183
See application file for complete search history.

(56) References Cited

U.S. PATENT DOCUMENTS

| | | | | |
|---|---|---|---|---|
| 5,216,579 A * | 6/1993 | Basara | ............ | G06F 1/184 174/481 |
| 5,388,032 A * | 2/1995 | Gill | ............ | A47B 21/0314 361/679.01 |
| 6,021,047 A * | 2/2000 | Lopez | ............ | H02B 1/36 312/223.2 |
| 6,219,249 B1 * | 4/2001 | Tuccio | ............ | H05K 7/183 312/223.2 |
| 6,535,391 B2 * | 3/2003 | Larsen | ............ | G06F 1/187 312/223.1 |
| 7,016,191 B2 * | 3/2006 | Miyamoto | ............ | G11B 33/144 361/679.33 |
| 7,480,154 B2 * | 1/2009 | Lawrence | ............ | H05K 7/1491 174/72 A |
| 7,576,979 B1 * | 8/2009 | Dearborn | ............ | H05K 7/1487 361/679.38 |
| 7,894,194 B2 * | 2/2011 | Shih | ............ | G06F 3/023 361/679.41 |
| 8,410,364 B2 * | 4/2013 | Dunwoody | ............ | H05K 7/1491 174/68.1 |
| 2005/0173357 A1 * | 8/2005 | McClain | ............ | G06F 1/181 211/26 |
| 2006/0220505 A1 * | 10/2006 | Nakamura | ............ | G06F 1/16 312/223.2 |
| 2007/0041693 A1 * | 2/2007 | Farrell | ............ | G02B 6/4452 385/135 |
| 2007/0230109 A1 * | 10/2007 | Starr | ............ | G11B 33/128 361/679.31 |
| 2008/0068788 A1 * | 3/2008 | Ozawa | ............ | H04Q 1/02 361/679.43 |

(Continued)

*Primary Examiner* — David M Sinclair
*Assistant Examiner* — Theron S Milliser
(74) *Attorney, Agent, or Firm* — FisherBroyles, LLP

(57) ABSTRACT

Technology is provided for a component mounting assembly. The component mounting assembly includes a support tray and a drawer positioned on the support tray that is moveable between a first position and a second position. The drawer includes a component mounting panel and at least one sidewall extending orthogonally from the component mounting panel. An elongate handle is pivotably attached to the drawer. The support tray supports the handle in an extended position when the drawer is in the first position, and the handle is movable to a folded position, orthogonal to the extended position, when the drawer is in the second position.

20 Claims, 7 Drawing Sheets

(56) References Cited

U.S. PATENT DOCUMENTS

| | | | |
|---|---|---|---|
| 2011/0273850 A1* | 11/2011 | Chen | H05K 5/0221 |
| | | | 361/726 |
| 2012/0182671 A1* | 7/2012 | Hou | H05K 7/1489 |
| | | | 361/679.01 |
| 2014/0255085 A1* | 9/2014 | Densberger | H05K 7/183 |
| | | | 403/205 |
| 2015/0334868 A1* | 11/2015 | Fricker | H05K 7/1489 |
| | | | 361/727 |

* cited by examiner

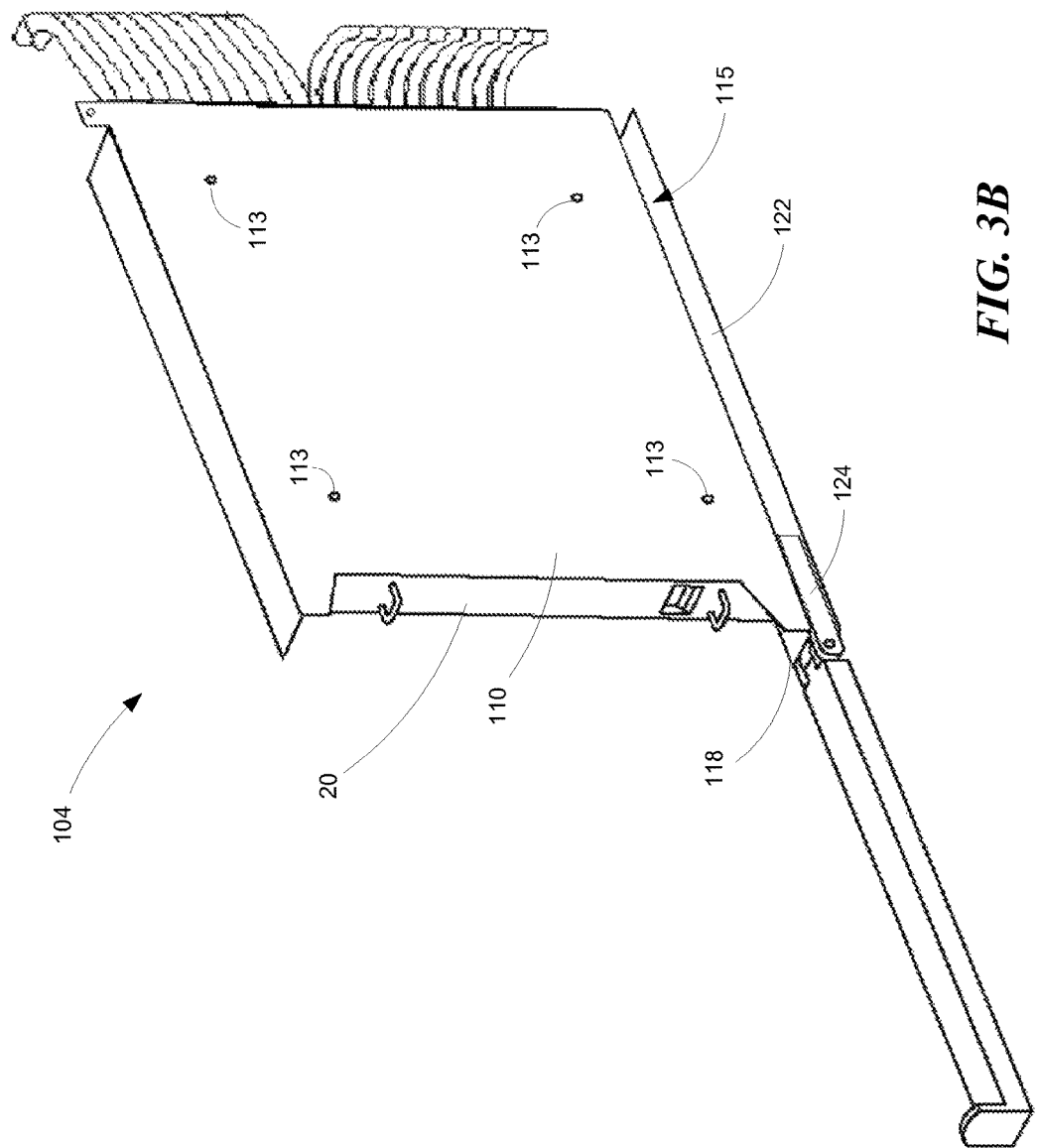

COMPONENT MOUNTING ASSEMBLY

TECHNICAL FIELD

This patent application is directed to data storage server configurations and, more specifically, to a component mounting assembly.

BACKGROUND

Various components, such as server modules, are stored in standard sized racks. However, not every component is the same size. Accordingly, the size of a component is not always the same size as the rack. In other words, the component may not always extend from the front of the rack all the way to the back of the rack. Thus, with traditional ways of mounting components in a rack, it may be difficult to service the back side of shorter components. Accordingly, there is need for component mounting solutions that accommodate for shorter components, such as to allow them to be easily serviced.

BRIEF DESCRIPTION OF THE DRAWINGS

Embodiments of the component mounting assembly introduced herein may be better understood by referring to the following Detailed Description in conjunction with the accompanying drawings, in which like reference numerals indicate identical or functionally similar elements:

FIG. 3B is an isometric view of the component mounting assembly drawer as viewed from the back.

Figure 1:
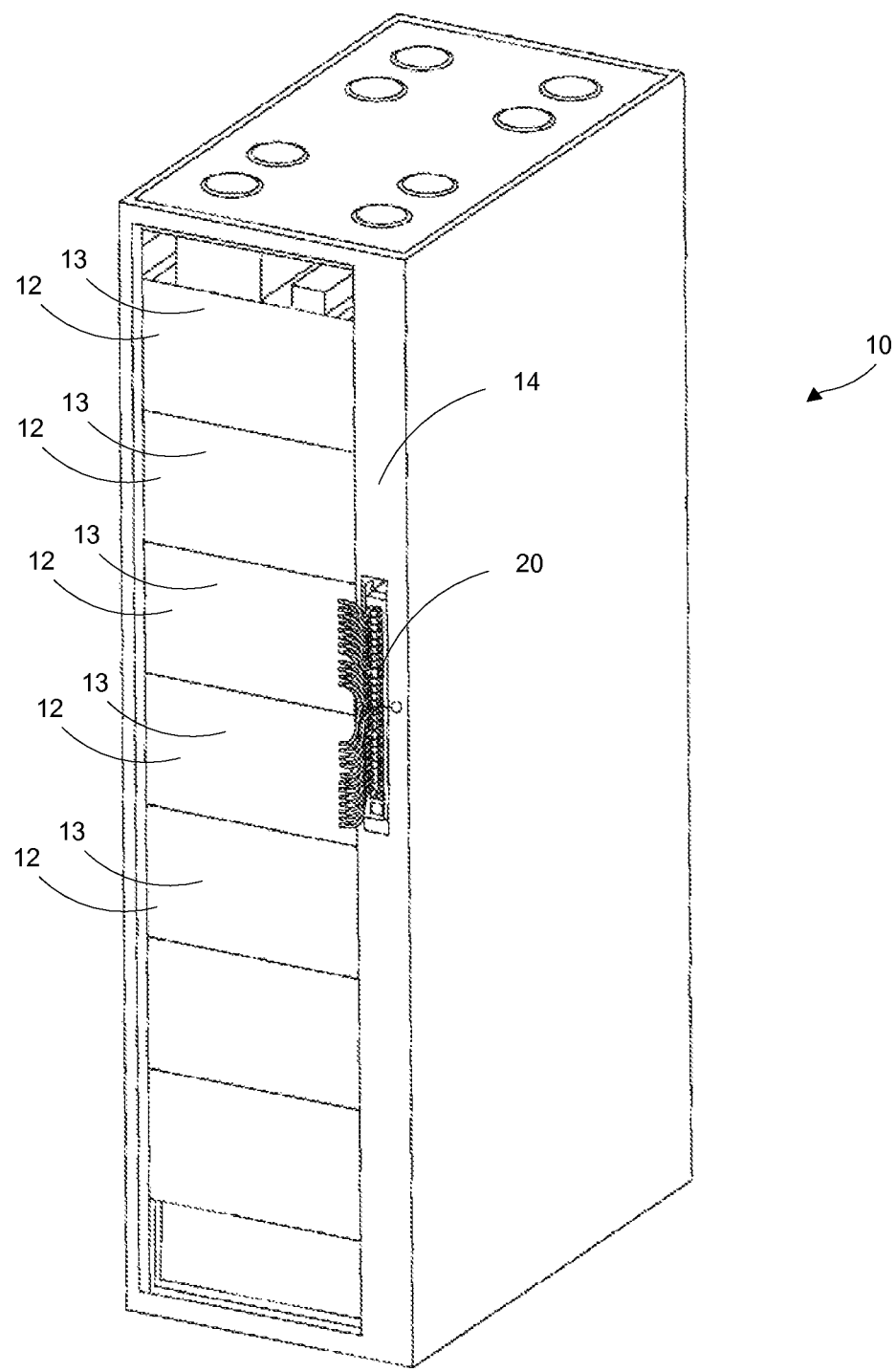
FIG. 1 is an isometric view of a representative rack or cabinet incorporating a component mounting assembly according to a representative embodiment.

The headings provided herein are for convenience only and do not necessarily affect the scope or meaning of the claimed embodiments. Further, the drawings have not necessarily been drawn to scale. For example, the dimensions of some of the elements in the figures may be expanded or reduced to help improve the understanding of the embodiments. Moreover, while the disclosed technology is amenable to various modifications and alternative forms, specific embodiments have been shown by way of example in the drawings and are described in detail below. The intention, however, is not to limit the embodiments described. On the contrary, the embodiments are intended to cover all modifications, equivalents, and alternatives falling within the scope of the embodiments as defined by the appended claims.

DETAILED DESCRIPTION

Overview

A component mounting assembly is disclosed for use in mounting a component in a rack or cabinet that has a depth greater than the component. In an embodiment, the component mounting assembly includes a support tray mountable within a cabinet and a drawer positioned on the support tray that is slideable between an operating position and a service position. The drawer can include a component mounting panel including apertures for mounting a component. An elongate handle is pivotably attached to the drawer, wherein the support tray supports the handle in an extended orientation when the drawer is in the operating position, and the handle is movable to a folded position, orthogonal to the extended position, when the drawer is in the service position. The handle provides a way for a technician to pull the component toward the back of the cabinet to service the component's power supplies and fans, for example. Once the component is moved to the service position, the handle can pivot out of the way to the folded position.

General Description

Various examples of the devices introduced above will now be described in further detail. The following description provides specific details for a thorough understanding and enabling description of these examples. One skilled in the relevant art will understand, however, that the techniques discussed herein may be practiced without many of these details. Likewise, one skilled in the relevant art will also understand that the technology can include many other features not described in detail herein. Additionally, some well-known structures or functions may not be shown or described in detail below so as to avoid unnecessarily obscuring the relevant description.

The terminology used below is to be interpreted in its broadest reasonable manner, even though it is being used in conjunction with a detailed description of some specific examples of the embodiments. Indeed, some terms may even be emphasized below; however, any terminology intended to be interpreted in any restricted manner will be overtly and specifically defined as such in this section.

Figure 2:
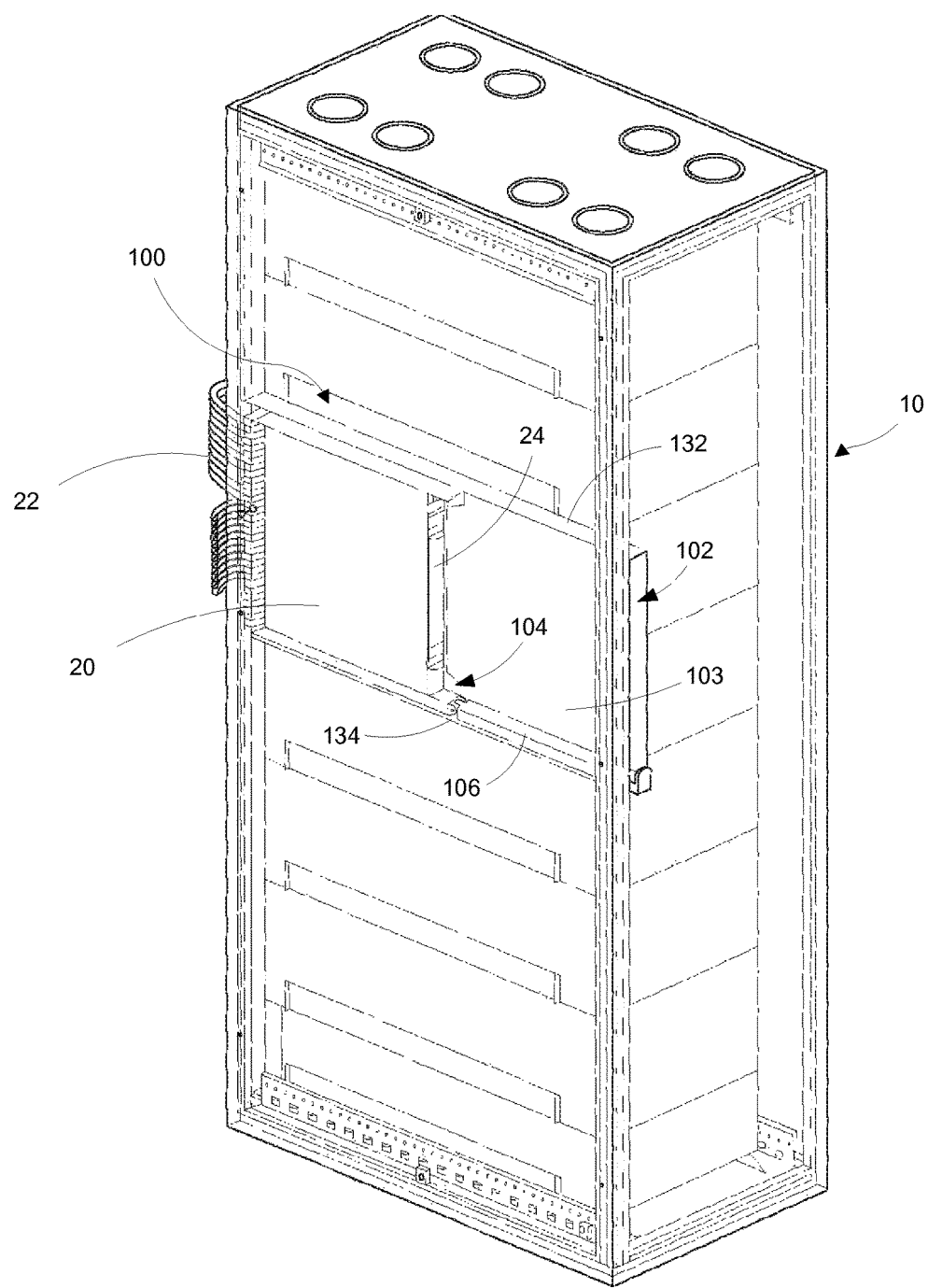
FIG. 2 is a partially transparent isometric view of the cabinet illustrating the location of the component mounting assembly.

FIG. 1 illustrates a rack or cabinet 10 that houses several horizontally oriented components 12 in one or more horizontal rack spaces 13. In the illustrated embodiment from the perspective as shown in FIG. 1, the cabinet 10 also has one or more vertical rack spaces 14 adjacent to the horizontal rack spaces 13 and which can house various vertically oriented components, such as fan trays, power supplies, and other data storage server equipment, including, as an example a switch 20. As shown in FIG. 2, the switch 20 is mounted in a component mounting assembly 100. The component mounting assembly 100 includes a sled guide, such as a vertically oriented support tray 102, and a component sled, such as a drawer 104 that is positioned on the support tray 102. The support tray 102 includes opposed first and second tray walls 132 and 134 that extend orthogonally from tray panel 103. The support tray 102 is mounted to the cabinet 10 with suitable hardware, such as brackets and fasteners (not shown). Although the component mounting assembly 100 is shown in a vertical orientation, the disclosed technology can be implemented in a horizontal orientation as well. In some embodiments, the support tray 102 and/or the drawer 104 are comprised of sheet metal, although other materials can be used. In some embodiments, the component sled comprises a component mounting panel and a sidewall extending from the component mounting panel. In some embodiments, the sled guide can comprise a pair of spaced apart guide walls or rails. In some embodiments, the rails can comprise lengths of angle material or angle brackets.

The drawer 104 of the illustrated embodiment has a front-to-back depth that is substantially less than the frontto-back depth of the cabinet's vertical rack space 14 and is moveable (e.g., slideable) relative to the support tray 102 and the 10 between an operating position (e.g., first position) and a service position (e.g., second position). In the operating position, the front portion of the drawer 104 is adjacent to the front of the cabinet 10, such that the switch's connectors 22 and associated cables located at the front portion of the switch 20 extend out of the front of cabinet 10 for connection with components 12, for example. Accordingly, the rear portion of the drawer 104 is positioned within the cabinet's interior area and spaced away from the rear of the cabinet when the drawer 104 is in the operating position. However, serviceable items, such as fans and power supplies, are typically located at the rear 24 of the switch 20 adjacent to the rear portion of the drawer 104 and are inaccessible when the drawer 104 and the switch 20 are in the operating position.

The drawer 104 along with the switch 20 are normally in the operating position as shown in FIG. 2. However, if the switch 20 requires servicing, the drawer 104 and the switch 20 are moved to the service position shown in FIGS. 5 and 6. In order to facilitate moving the drawer 104 and the switch 20 to the service position, an elongate handle 106 is pivotably attached to drawer 104 and is supported in an extended position by the support tray wall 134 when the drawer 104 is in the operating position.

Figure 3A:
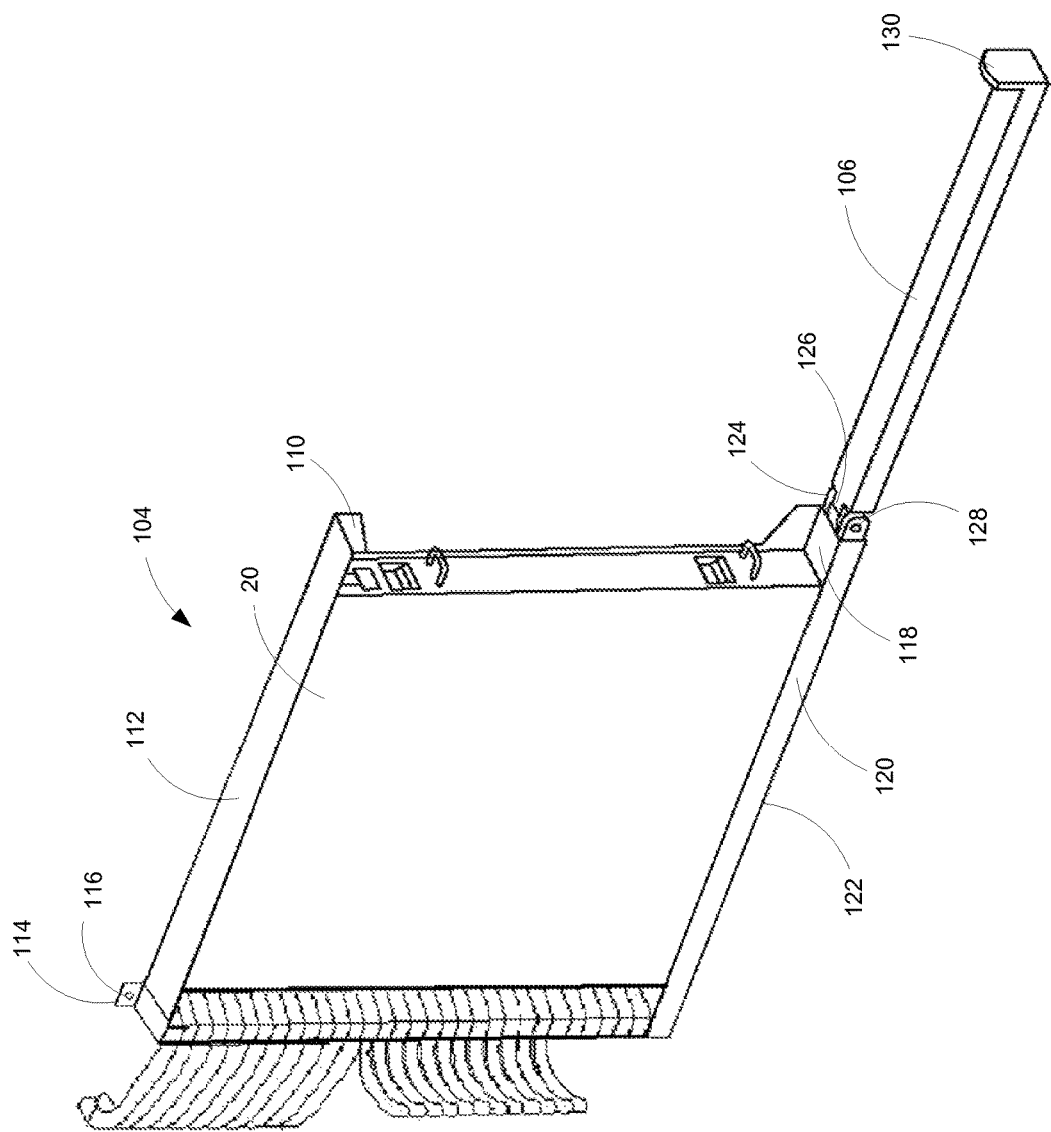
FIG. 3A is an isometric view of the component mounting assembly drawer as viewed from the front.

As shown in FIGS. 3A and 3B, the drawer 104 includes first and second sidewall flanges 112 and 118 that extend orthogonally from a component mounting panel 110. A cross flange 120 extends orthogonally from the second sidewall flange 118, and a return flange 122 extends orthogonally from the cross flange 120. Thus, the second sidewall flange 118 and the return flange 122 are parallel to each other. In some embodiments, the handle 106 is attached to the drawer 104 with a handle bracket disposed in a channel 115 formed by the cross flange 120 and the return flange 122. In the illustrated embodiment, the handle bracket is a clevis 124 that mates with an eye portion 126 on the handle 106. In some embodiments, the handle bracket is mounted to cross flange 120 and/or the return flange 122. The clevis 124 and the eye portion 126 are rotatably coupled with a suitable fastener, such as pin 128. In some embodiments, the handle 106 can include a pull tab 130 to facilitate grasping the handle. With reference to FIG. 3B, the component mounting panel 110 includes a plurality of component mounting features, such as mounting holes or apertures 113. Accordingly, the switch 20 can be fastened to the drawer 104 with suitable fasteners extending through the apertures 113. In some embodiments, the component mounting panel 110 may also include a retainer tab 114 with a suitable aperture 116 to receive a fastener for retaining the drawer 104 in the operating position.

Figure 4:
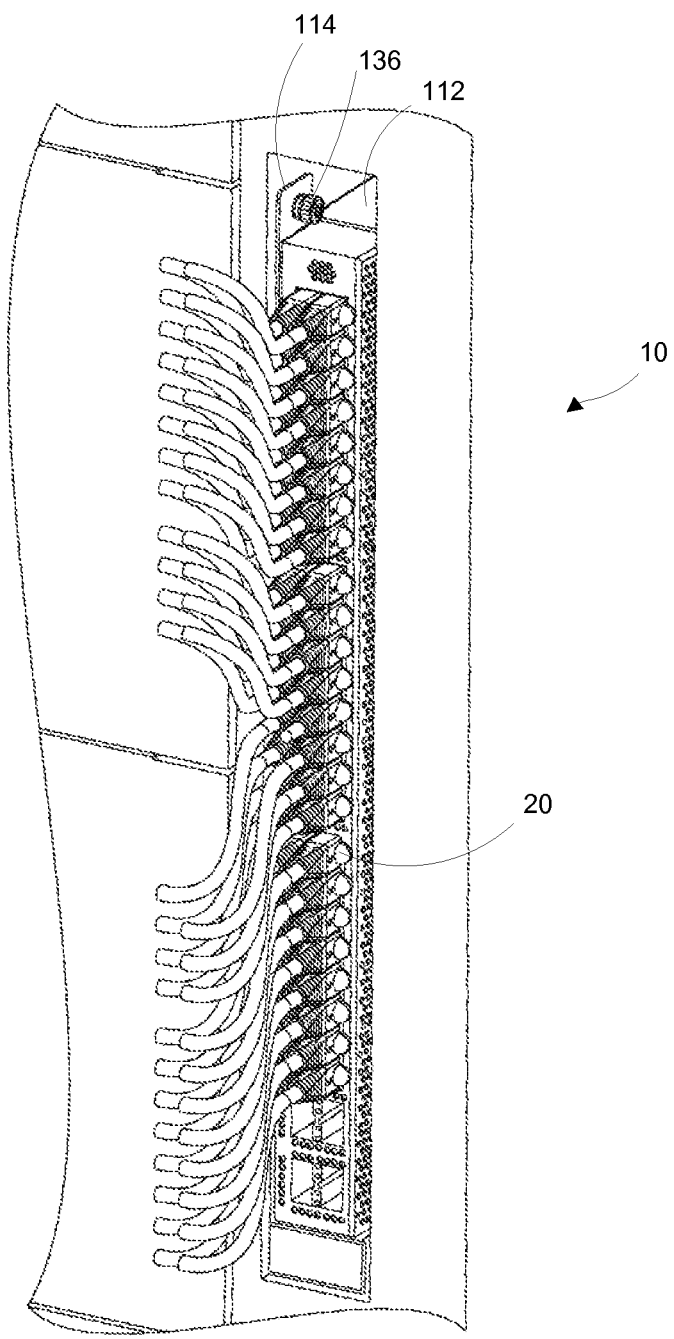
FIG. 4 is an enlarged partial isometric view of the component mounting assembly's retainer tab and fastener.

As shown in FIG. 4, the retainer tab 114 supports a fastener 136 that mates with a corresponding aperture (not shown) on the support tray 102. In the event that the switch 20 requires service, the fastener 136 can be unscrewed from the support tray 102, whereby the drawer 104 may be pulled towards the back of the cabinet 10 with the handle 106, as shown in FIG. 5.

Figure 5:
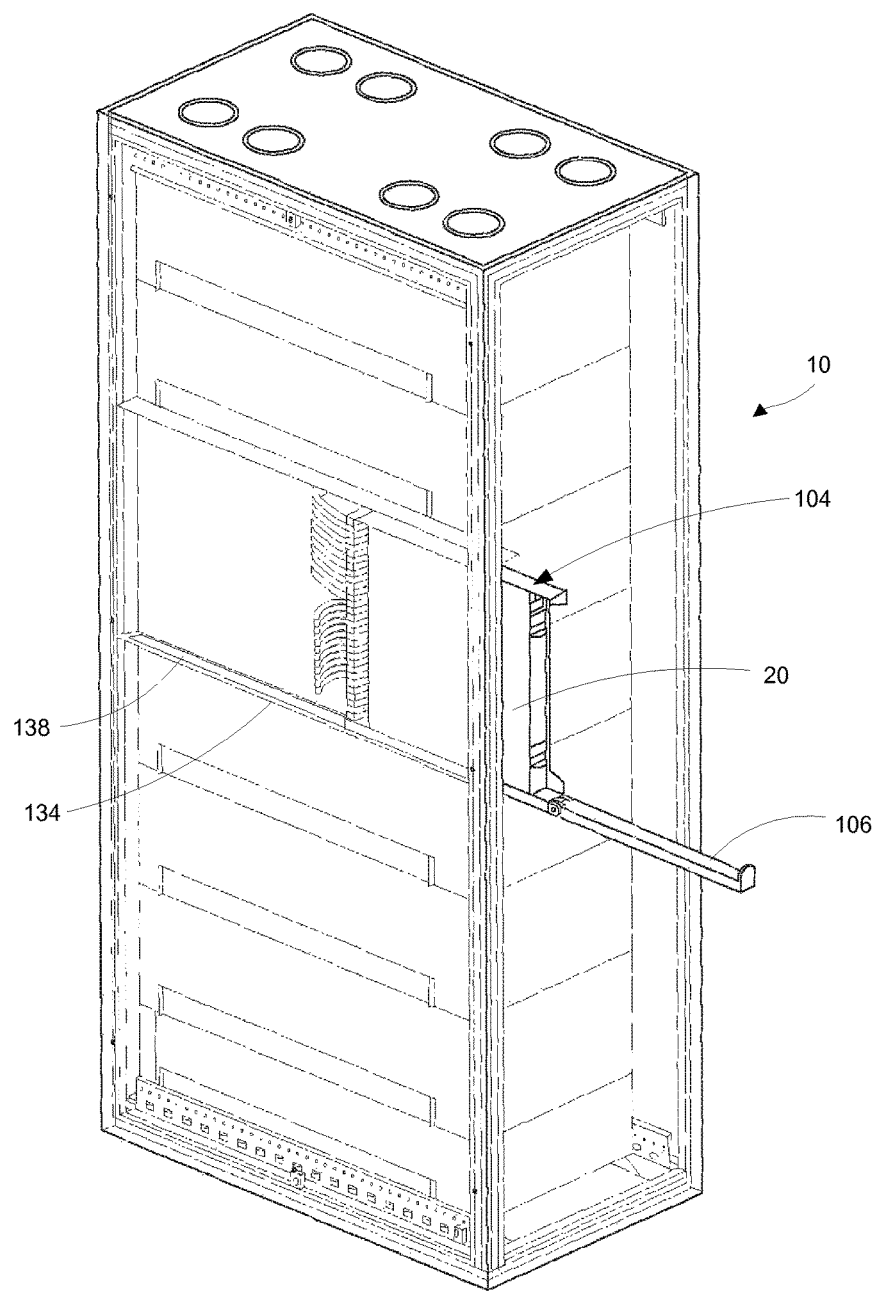
FIG. 5 is a partially transparent isometric view of the cabinet illustrating the component mounting assembly drawer in the service position.
Figure 6:
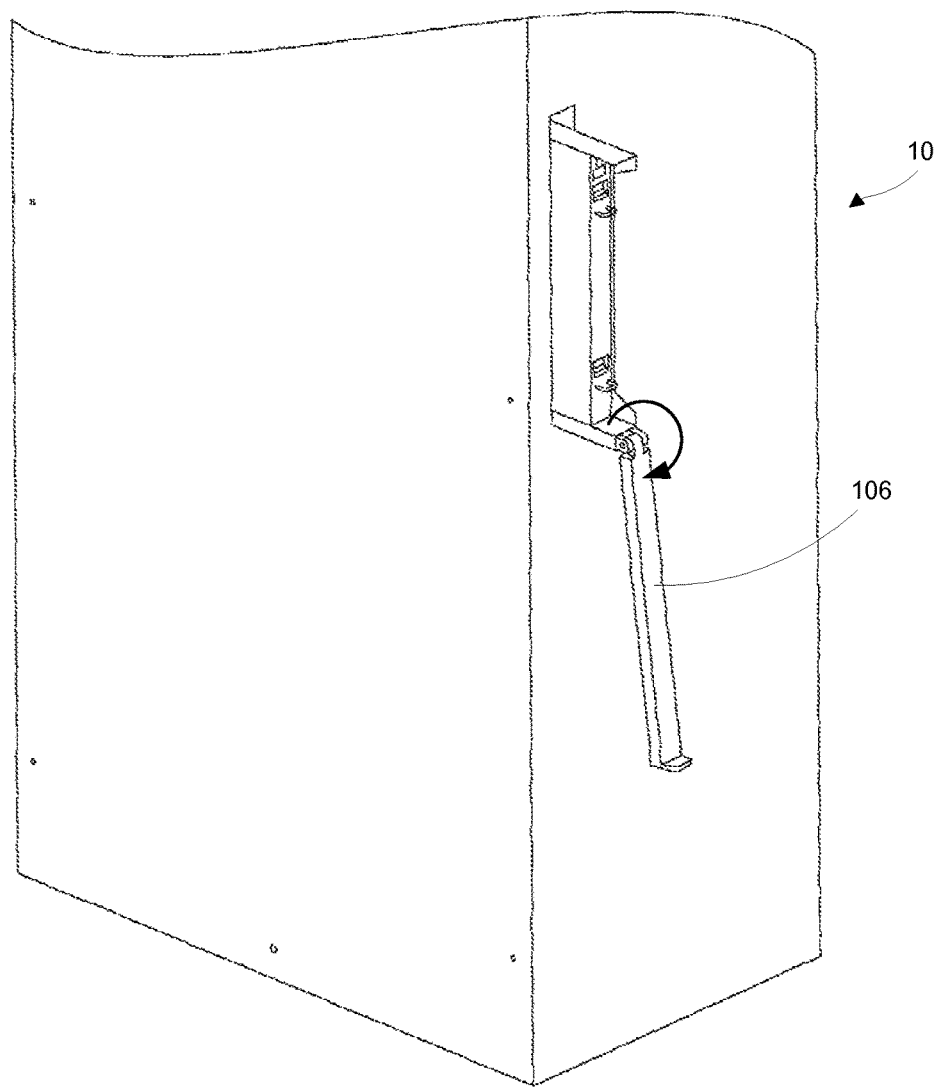
FIG. 6 is a partial isometric view of the cabinet illustrating the handle in a folded position.

In FIG. 5, the drawer 104 and the switch 20 have been pulled to the service position by the handle 106. In some embodiments, a bearing member 138 is positioned between the drawer 104 and one or more of the support tray walls 134, 132. In some embodiments, the bearing member 138 is an elongate strip of ultra-high molecular weight polyethylene or other suitable plastic material. As shown in FIG. 6, once the drawer 104 and the switch 20 have been moved to the service position, the handle 106 may be pivoted to a folded position where it is out of the way for service operations.

Remarks

The above description and drawings are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments. Accordingly, the embodiments are not limited except as by the appended claims.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. It will be appreciated that the same thing can be said in more than one way. Consequently, alternative language and synonyms may be used for any one or more of the terms discussed herein, and any special significance is not to be placed upon whether or not a term is elaborated or discussed herein. Synonyms for some terms are provided. A recital of one or more synonyms does not exclude the use of other synonyms. The use of examples anywhere in this specification, including examples of any term discussed herein, is illustrative only and is not intended to further limit the scope and meaning of the disclosure or of any exemplified term. Likewise, the disclosure is not limited to various embodiments given in this specification. Unless otherwise defined, all technical and scientific terms used herein have the same meaning as commonly understood by one of ordinary skill in the art to which this disclosure pertains. In the case of conflict, the present document, including definitions, will control.

What is claimed is:

1. A component mounting assembly, comprising:
    a sled guide;
    a component sled positioned on the sled guide and moveable relative to the sled guide between a first position and a second position, the component sled including:
        a component mounting panel; and
        a sidewall extending from the component mounting panel; and
    an elongate handle pivotably attached to the sidewall, wherein the sled guide supports the elongate handle in an extended position when the component sled is in the first position, and the elongate handle is movable to a folded position away from the extended position when the component sled is in the second position.

2. The component mounting assembly of claim 1, wherein the elongate handle is parallel to the sidewall when in the extended position.

3. The component mounting assembly of claim 1, wherein the sled guide includes first and second opposed guide walls.

4. The component mounting assembly of claim 3, wherein the component sled is supported on one of the first and second opposed guide walls.

5. The component mounting assembly of claim 1, further comprising a cabinet having rack space configured to retain a plurality of electronic components, wherein the sled guide is carried by the cabinet within the rack space.

6. The component mounting assembly of claim 1, further comprising a fastener attached to the component mounting panel and positioned to engage the sled guide when the component sled is in the first position.

7. The component mounting assembly of claim 1, further comprising a bearing member disposed between the sidewall and the sled guide.

8. A component mounting assembly for mounting a component inside a cabinet, the component mounting assembly comprising:
- a support tray mountable within a cabinet;
- a drawer positioned on the support tray and slideable relative to the support tray between a first position and a second position, the drawer including:
  - a component mounting panel including one or more mounting features;
  - a first sidewall extending from the component mounting panel; and
  - a second sidewall spaced apart from the first sidewall; and
- an elongate handle pivotably attached to the first sidewall, wherein the support tray supports the elongate handle in an extended position when the drawer is in the first position, and the elongate handle is movable relative to the support tray away from the extended position to a folded position when the drawer is in the second position.

9. The component mounting assembly of claim 8, wherein the support tray and the drawer are vertically oriented within the cabinet.

10. The component mounting assembly of claim 8, wherein the one or more mounting features comprises a plurality of apertures.

11. The component mounting assembly of claim 8, wherein the support tray includes first and second opposed tray walls.

12. The component mounting assembly of claim 11, wherein the drawer is supported on the first tray wall.

13. The component mounting assembly of claim 12, further comprising a bearing member disposed between the first sidewall and the first tray wall.

14. The component mounting assembly of claim 12, further comprising a fastener attached to the component mounting panel adjacent the second sidewall and positioned to engage the support tray adjacent the second tray wall when the drawer is in the first position.

15. A component mounting assembly for mounting an electronic component inside a cabinet, the component mounting assembly comprising:
- a support tray mountable within a cabinet;
- a drawer positioned on the support tray and slideable between an operating position and a service position, including:
  - a component mounting panel including a plurality of component mounting features;
  - a sidewall flange extending orthogonally from the component mounting panel;
  - a cross flange extending orthogonally from the sidewall flange; and
  - a return flange extending orthogonally from the cross flange;
- a handle bracket positioned between the sidewall flange and the return flange; and
- an elongate handle attached to the handle bracket, wherein the support tray supports the elongate handle in an extended position when the sheet metal drawer is in the operating position, and the elongate handle is movable to a folded position orthogonal to the extended position when the sheet metal drawer is in the service position.

16. The component mounting assembly of claim 15, further comprising a second sidewall flange extending orthogonally from the component mounting panel and opposite the sidewall flange.

17. The component mounting assembly of claim 15, wherein the handle bracket comprises a clevis, and the elongate handle includes an eye portion mated with the clevis.

18. The component mounting assembly of claim 15, wherein the support tray and the drawer are vertically oriented within the cabinet.

19. The component mounting assembly of claim 18, further comprising a bearing member disposed between the sidewall flange and the support tray.

20. The component mounting assembly of claim 15, further comprising a fastener attached to the component mounting panel and positioned to engage the support tray when the drawer is in the operating position.

* * * * *